(12) United States Patent
Zhao et al.

(10) Patent No.: US 9,000,847 B2
(45) Date of Patent: Apr. 7, 2015

(54) DIGITAL TUNABLE INTER-STAGE MATCHING CIRCUIT

(75) Inventors: Yu Zhao, San Diego, CA (US); Babak Nejati, San Diego, CA (US); Nathan M Pletcher, Encinitas, CA (US); Aristotele Hadjichristos, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/226,397

(22) Filed: Sep. 6, 2011

(65) Prior Publication Data

US 2011/0316636 A1 Dec. 29, 2011

Related U.S. Application Data

(63) Continuation of application No. 12/715,254, filed on Mar. 1, 2010.

(60) Provisional application No. 61/235,312, filed on Aug. 19, 2009.

(51) Int. Cl.
| | |
|---|---|
| H03F 3/04 | (2006.01) |
| H03H 7/40 | (2006.01) |
| H03F 1/22 | (2006.01) |
| H03F 1/42 | (2006.01) |
| H03F 3/193 | (2006.01) |

(52) U.S. Cl.
CPC . *H03F 1/42* (2013.01); *H03H 7/40* (2013.01); *H03F 1/223* (2013.01); *H03F 2200/318* (2013.01); *H03F 3/193* (2013.01)

(58) Field of Classification Search
CPC ............................ H03F 3/191; H03F 2200/546
USPC ................................... 330/98, 150, 302, 310
See application file for complete search history.

(56) References Cited

U.S. PATENT DOCUMENTS

| | | |
|---|---|---|
| 4,015,223 A | 3/1977 | Cheze |
| 4,263,653 A | 4/1981 | Mecklenburg |
| 4,375,051 A | 2/1983 | Theall |

(Continued)

FOREIGN PATENT DOCUMENTS

| | | |
|---|---|---|
| CN | 1282140 A | 1/2001 |
| CN | 1367952 A | 9/2002 |

(Continued)

OTHER PUBLICATIONS

Chowdhury D et al., "A single-chip highly linear 2.4GHz 30dBm power amplifier in 90nm CMOS", Solid-State Circuits Conference—Digest of Technical Papers, 2009, ISSCC 2009, IEEE International, IEEE, Piscataway, NJ, USA, Feb. 8, 2009, pp. 378-379,379A, XP031466144, ISBN, 978-1-4244-3458-9.

(Continued)

*Primary Examiner* — Henry Choe
(74) *Attorney, Agent, or Firm* — Ramin Mobarhan

(57) ABSTRACT

A tunable inter-stage matching circuit that can improve performance is described. In an exemplary design, an apparatus comprises a driver amplifier and a power amplifier. The apparatus may further include an inter-stage matching circuit tunable in discrete steps for matching impedances between the driver amplifier and the power amplifier. The tunable inter-stage matching circuit may include a bank of capacitors, each capacitor of the bank coupled in series with a switch for coupling the capacitor to a ground voltage.

19 Claims, 11 Drawing Sheets

(56) References Cited

U.S. PATENT DOCUMENTS

| | | | |
|---|---|---|---|
| 4,493,112 A | 1/1985 | Bruene | |
| 4,559,503 A * | 12/1985 | Camand et al. | 330/302 |
| 4,612,669 A | 9/1986 | Nossen | |
| 5,023,688 A | 6/1991 | Ando et al. | |
| 5,208,537 A | 5/1993 | Rietsch et al. | |
| 5,300,068 A | 4/1994 | Rosar et al. | |
| 5,361,403 A | 11/1994 | Dent | |
| 5,483,680 A | 1/1996 | Talbot | |
| 5,530,923 A | 6/1996 | Heinonen et al. | |
| 5,541,554 A | 7/1996 | Stengel et al. | |
| 5,564,086 A | 10/1996 | Cygan et al. | |
| 5,673,287 A | 9/1997 | Colvis et al. | |
| 5,774,017 A | 6/1998 | Adar | |
| 5,778,308 A | 7/1998 | Sroka et al. | |
| 5,969,582 A | 10/1999 | Boesch et al. | |
| 5,973,557 A | 10/1999 | Miyaji et al. | |
| 5,978,192 A | 11/1999 | Young et al. | |
| 6,020,794 A | 2/2000 | Wilbur | |
| 6,166,598 A | 12/2000 | Schlueter | |
| 6,188,877 B1 | 2/2001 | Boesch et al. | |
| 6,215,359 B1 | 4/2001 | Peckham et al. | |
| 6,317,608 B1 | 11/2001 | Glocker | |
| 6,362,690 B1 | 3/2002 | Tichauer | |
| 6,370,364 B1 | 4/2002 | Liimatainen | |
| 6,389,269 B1 | 5/2002 | Nanni et al. | |
| 6,414,562 B1 | 7/2002 | Bouisse et al. | |
| 6,441,768 B2 | 8/2002 | Cho et al. | |
| 6,570,462 B2 | 5/2003 | Edmonson et al. | |
| 6,603,351 B2 * | 8/2003 | Suzuki | 330/133 |
| 6,606,483 B1 | 8/2003 | Baker et al. | |
| 6,759,916 B2 * | 7/2004 | Ishizaki et al. | 333/17.1 |
| 6,771,130 B2 * | 8/2004 | Hasegawa et al. | 330/302 |
| 6,859,104 B2 * | 2/2005 | Toncich et al. | 330/302 |
| 6,865,399 B2 | 3/2005 | Fujioka et al. | |
| 6,946,847 B2 | 9/2005 | Nishimori et al. | |
| 6,950,637 B2 | 9/2005 | Kim | |
| 6,992,543 B2 * | 1/2006 | Luetzelschwab et al. | 333/32 |
| 7,009,455 B2 * | 3/2006 | Toncich et al. | 330/305 |
| 7,010,073 B2 | 3/2006 | Black et al. | |
| 7,126,386 B2 | 10/2006 | Tumer et al. | |
| 7,151,411 B2 | 12/2006 | Martin et al. | |
| 7,176,634 B2 | 2/2007 | Kitamura et al. | |
| 7,187,231 B2 | 3/2007 | McGrath et al. | |
| 7,215,933 B1 | 5/2007 | Tse et al. | |
| 7,417,508 B1 | 8/2008 | Quaglietta | |
| 7,443,236 B2 * | 10/2008 | Dow et al. | 330/51 |
| 7,509,100 B2 * | 3/2009 | Toncich | 455/107 |
| 7,512,386 B2 | 3/2009 | Kalajo et al. | |
| 7,580,684 B2 | 8/2009 | Cyr et al. | |
| 7,616,054 B2 | 11/2009 | Jeon et al. | |
| 7,764,125 B2 * | 7/2010 | Dawe | 330/305 |
| 7,782,134 B2 | 8/2010 | Drogi et al. | |
| 7,868,699 B2 * | 1/2011 | Ono et al. | 330/302 |
| 7,893,763 B2 | 2/2011 | Andrews | |
| 7,893,769 B2 * | 2/2011 | Asano | 330/285 |
| 7,911,277 B2 | 3/2011 | Paul et al. | |
| 7,917,170 B2 | 3/2011 | Zhitnitsky | |
| 8,000,737 B2 | 8/2011 | Caimi et al. | |
| 8,072,272 B2 | 12/2011 | Zhao et al. | |
| 8,111,111 B2 | 2/2012 | Van | |
| 8,131,232 B2 | 3/2012 | Muhammad | |
| 8,140,033 B2 | 3/2012 | Chan et al. | |
| 8,213,886 B2 | 7/2012 | Blin | |
| 8,280,323 B2 | 10/2012 | Thompson | |
| 8,306,490 B2 | 11/2012 | Tanoue et al. | |
| 8,368,470 B2 | 2/2013 | Alidio et al. | |
| 2002/0094037 A1 | 7/2002 | Darabi et al. | |
| 2003/0060227 A1 | 3/2003 | Sekine et al. | |
| 2003/0193997 A1 | 10/2003 | Dent et al. | |
| 2004/0132441 A1 | 7/2004 | Livet et al. | |
| 2004/0224649 A1 | 11/2004 | Shamsaifar | |
| 2005/0159119 A1 | 7/2005 | Kataoka et al. | |
| 2005/0221855 A1 | 10/2005 | Kuriyama et al. | |
| 2005/0225388 A1 | 10/2005 | Ramachandran et al. | |
| 2005/0227640 A1 | 10/2005 | Haque et al. | |
| 2006/0028301 A1 | 2/2006 | Kamata et al. | |
| 2006/0053321 A1 | 3/2006 | Mizusawa | |
| 2006/0160501 A1 | 7/2006 | Mendolia et al. | |
| 2006/0164162 A1 | 7/2006 | Dauphinee et al. | |
| 2006/0166664 A1 | 7/2006 | Livet et al. | |
| 2006/0261895 A1 | 11/2006 | Kocaman et al. | |
| 2007/0109698 A1 | 5/2007 | Kim | |
| 2007/0197180 A1 | 8/2007 | McKinzie et al. | |
| 2007/0207748 A1 | 9/2007 | Toncich | |
| 2007/0218844 A1 | 9/2007 | Alanen et al. | |
| 2007/0222523 A1 | 9/2007 | Arell | |
| 2007/0291173 A1 | 12/2007 | Hsin | |
| 2008/0026709 A1 | 1/2008 | Liu et al. | |
| 2008/0242237 A1 | 10/2008 | Rofougaran et al. | |
| 2008/0266021 A1 | 10/2008 | Van Bezooijen et al. | |
| 2008/0284539 A1 | 11/2008 | Tateoka et al. | |
| 2009/0002077 A1 | 1/2009 | Rohani et al. | |
| 2009/0135536 A1 | 5/2009 | Kappes | |
| 2009/0318093 A1 | 12/2009 | Prikhodko et al. | |
| 2010/0081410 A1 | 4/2010 | Kaido et al. | |
| 2010/0308933 A1 | 12/2010 | See et al. | |
| 2010/0321086 A1 | 12/2010 | See et al. | |
| 2011/0018632 A1 | 1/2011 | Pletcher et al. | |
| 2011/0043956 A1 | 2/2011 | Su et al. | |
| 2012/0112834 A1 | 5/2012 | Van | |

FOREIGN PATENT DOCUMENTS

| | | | |
|---|---|---|---|
| CN | 1677848 A | 10/2005 | |
| CN | 1826727 A | 8/2006 | |
| CN | 1870423 A | 11/2006 | |
| CN | 101095285 A | 12/2007 | |
| CN | 101432973 A | 5/2009 | |
| CN | 101502004 A | 8/2009 | |
| EP | 0982852 A2 | 3/2000 | |
| EP | 1727279 A1 | 11/2006 | |
| EP | 1916772 A1 | 4/2008 | |
| GB | 2356093 A | 5/2001 | |
| JP | S62262508 A | 11/1987 | |
| JP | S6361812 U | 4/1988 | |
| JP | H02161769 A | 6/1990 | |
| JP | H03128336 U | 12/1991 | |
| JP | H04207521 A | 7/1992 | |
| JP | H04368022 A | 12/1992 | |
| JP | H07263986 A | 10/1995 | |
| JP | H08167819 A | 6/1996 | |
| JP | 11055047 | 2/1999 | |
| JP | H11251928 A | 9/1999 | |
| JP | 2000150779 A | 5/2000 | |
| JP | 2000512460 A | 9/2000 | |
| JP | 2001068941 A | 3/2001 | |
| JP | 3192907 B2 | 7/2001 | |
| JP | 2002535860 A | 10/2002 | |
| JP | 2003504929 A | 2/2003 | |
| JP | 2003087129 A | 3/2003 | |
| JP | 2003516083 A | 5/2003 | |
| JP | 2003174367 A | 6/2003 | |
| JP | 2004085446 A | 3/2004 | |
| JP | 2005045440 A | 2/2005 | |
| JP | 2005128721 A | 5/2005 | |
| JP | 2005210316 A | 8/2005 | |
| JP | 2005524325 A | 8/2005 | |
| JP | 2005268895 A | 9/2005 | |
| JP | 2005294894 A | 10/2005 | |
| JP | 2006074595 A | 3/2006 | |
| JP | 2006279190 A | 10/2006 | |
| JP | 2007013790 A | 1/2007 | |
| JP | 2007503167 A | 2/2007 | |
| JP | 2007060455 A | 3/2007 | |
| JP | 2007081593 A | 3/2007 | |
| JP | 2007104355 A | 4/2007 | |
| JP | 2007531470 A | 11/2007 | |
| JP | 2008516508 A | 5/2008 | |
| JP | 2008521318 A | 6/2008 | |
| JP | 2008521319 A | 6/2008 | |
| JP | 2008219758 A | 9/2008 | |
| JP | 2008288769 A | 11/2008 | |
| JP | 2010081383 A | 4/2010 | |
| WO | 9748183 A1 | 12/1997 | |

(56) References Cited

FOREIGN PATENT DOCUMENTS

| WO | 0042585 A1 | 7/2000 |
|---|---|---|
| WO | WO0105028 | 1/2001 |
| WO | 0141306 A1 | 6/2001 |
| WO | 03094345 A2 | 11/2003 |
| WO | WO2004034569 | 4/2004 |
| WO | 2005006832 A2 | 1/2005 |
| WO | 2005020433 A2 | 3/2005 |
| WO | 2005101649 A2 | 10/2005 |
| WO | 2005101678 A2 | 10/2005 |
| WO | WO2006038167 A1 | 4/2006 |
| WO | 2006054245 A1 | 5/2006 |
| WO | WO2006054246 A1 | 5/2006 |
| WO | 2007107633 A1 | 9/2007 |
| WO | 2008014029 A2 | 1/2008 |
| WO | 2008114455 A1 | 9/2008 |

OTHER PUBLICATIONS

International Search Report and Written Opinion—PCT/US2010/046021—ISA/EPO—Mar. 9, 2011.

Minsik Ahn, et al., "A Novel Multi-Stack Device Structure and its Analysis for High Power CMOS Switch Design", Microwave Symposium, 2007. IEEE/MTT-S International, IEEE, PI, Jun. 1, 2007, pp. 1393-1396, XP031112198, ISBN: 978-1-4244-0687-6.

Tongqiang Gao, et al., "A novel CMOS transmitter front-end for mobile RFID reader", Radio Frequency Integrated Circuits Symposium, 2009. RFIC 2009. IEEE, IEEE, Piscataway, NJ, USA, Jun. 7, 2009, pp. 105-108, XP031480236, ISBN: 978-1-4244-3377-3.

Wang et al., "A Nonlinear Capacitance Cancellation Technique and its Application to a CMOS Class AB Power Amplifier," 2001, IEEE Radio Frequency Integrated Circuits Symposium, May 20, 2001, pp. 39-42, XP010551317.

Adar, A. et al., "A High Efficiency Single Chain GaAs MESFET MMIC Dual Band Power Amplifier for GSM/DCS Handsets", Gallium Arsenide Integrated Circuit (GaAs IC) Symposium, 1998. Technical Digest 1998., 20th Annual; Digital Object Identifier: 10.1109/GAAS.1998.722629; Publication Year: 1998, pp. 69-72.

Bezooijen A, et al., "Power Amplifier Protection by Adaptive Output Power Control", IEEE JSSC, vol. 42, No. 9, Sep. 2007, pp. 1834-1841.

Carrara F, et al., "A Methodology for Fast VSWR Protection Implemented in a Monolithic 3-W 55% PAE RF CMOS Power Amplifier", IEEE JSSC, vol. 43, No. 9, Sep. 2008, pp. 2057-2066.

Sanielevici S A, et al., "A 900-MHz Transceiver Chipset for Two-Way Paging Applications", IEEE JSSC, vol. 33, No. 12, Dec. 1998, pp. 2160-2168.

Scuderi A, et al., "A VSWR-Protected Silicon Bipolar RF Power Amplifiers with Soft-Slope Power Control", IEEE JSSC, vol. 40, No. 3, Mar. 2005, pp. 611-621.

Su D, et al., "An IC for Linearizing RF Power Amplifiers Using Envelope Elimination and Restoration", IEEE JSSC, vol. 33, No. 12, Dec. 1998, pp. 2252-2258.

Vaha-Heikkila T. et al., "A 20-50 Ghz Reconfigurable Match Network for Power Amplifier Applications", Microwave Symposium Digest, 2004 IEEE MTT-S International; vol. 2 Digital Object Identifier: 10.1109/MWSYM.2004.1339059; Publication Year: 2004, pp. 717-720 vol. 2.

van Bezooijen, A., et al., "Adaptive Impedance-Matching Techniques for Controlling L Networks", Circuits and Systems I: Regular Papers, IEEE Transactions on; vol. 57, Issue: 2; Digital Object Identifier: 10.1 109/TCSI.2009.2023764 Feb. 2010, pp. 495-505.

Yao-Jen Chuang, et al., "A novel bubble tolerant thermometer-to-binary encoder for flash A/D converter", VLSI Design, Automation and Test, 2005. (VLSI-TSA-DAT). 2005 IEEE VLSI Apr. 27, 2005-Apr. 29, 2005 Piscataway, NJ, USA,IEEE, US, Apr. 27, 2005, pp. 315-318, XP010829593, DOI: DOI:10.1109/VDAT.2005.1500084 ISBN: 978-0-7803-9060-7 the whole document.

\* cited by examiner

DIGITAL TUNABLE INTER-STAGE MATCHING CIRCUIT

I. CLAIM OF PRIORITY UNDER 35 U.S.C. §120

The present Application for Patent is a Continuation and claims priority to patent application Ser. No. 12/715,254 entitled "DIGITAL TUNABLE INTER-STAGE MATCHING CIRCUIT," filed Mar. 1, 2010, and Provisional U.S. Application Ser. No. 61/235,312, entitled "DIGITAL TUNABLE PA INTER-STAGE MATCHING," filed Aug. 19, 2009, assigned to the assignee hereof, and expressly incorporated herein by reference.

BACKGROUND

I. Field

The present disclosure relates generally to electronics, and more specifically to a matching circuit.

II. Background

Amplifiers are commonly used in various electronic devices to provide signal amplification. Different types of amplifiers are available for different uses. For example, a wireless communication device such as a cellular phone may include a transmitter and a receiver for bi-directional communication. The transmitter may include a driver amplifier (DA) and a power amplifier (PA), the receiver may include a low noise amplifier (LNA), and the transmitter and receiver may include variable gain amplifiers (VGAs).

A transmitter may include a driver amplifier and a power amplifier coupled in series. The driver amplifier may have an output impedance of Z1. The power amplifier may have an input impedance of Z2, which may be different from Z1. An impedance matching circuit may be coupled between the driver amplifier and the power amplifier and may be used to match the Z1 impedance at the output of the driver amplifier to the Z2 impedance at the input of the power amplifier. It may be desirable to perform impedance matching in an effective manner so that high gain, high output power, and high power-added efficiency (PAE) can be obtained for the power amplifier.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for performing impedance matching between active circuits are described herein. The techniques may be used for impedance matching of amplifiers and other active circuits. The techniques may also be used for various electronic devices such as wireless communication devices, cellular phones, personal digital assistants (PDAs), handheld devices, wireless modems, laptop computers, cordless phones, Bluetooth devices, consumer electronic devices, etc. For clarity, the use of the techniques for a wireless communication device is described below.

Figure 1:
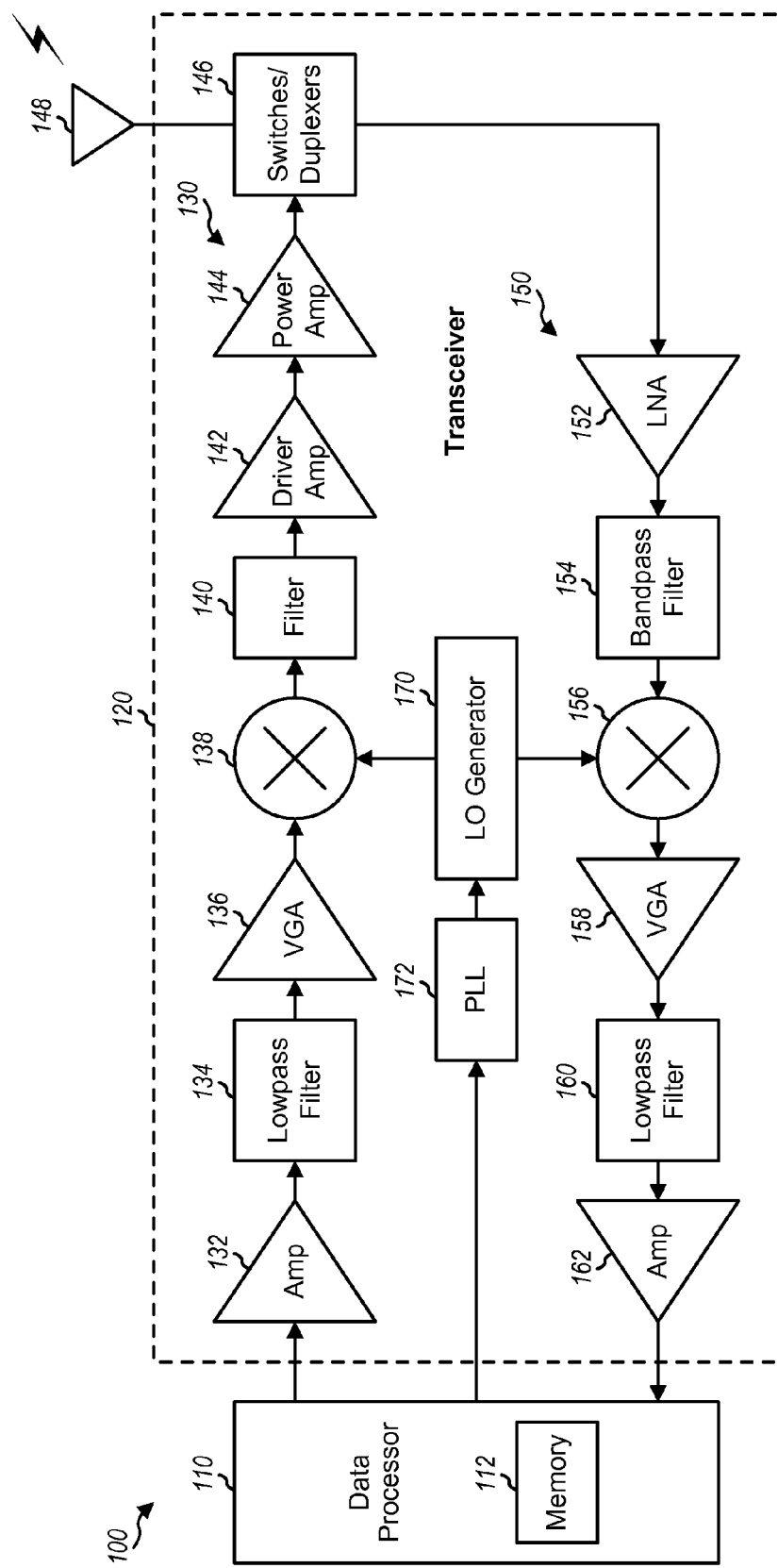
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to radio frequency (RF) by a mixer 138. The upconverted signal is filtered by a filter 140, further amplified by a driver amplifier 142 and a power amplifier 144, routed through switches/duplexers 146, and transmitted via an antenna 148.

In the receive path, antenna 148 receives signals from base stations and/or other transmitter stations and provides a received signal, which is routed through switches/duplexers 146 and provided to receiver 150. Within receiver 150, the received signal is amplified by an LNA 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a super-heterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and receiver. For example, matching circuits may be used to match various active circuits in FIG. 1. Some circuits in FIG. 1 may also be omitted. Transceiver 120 may be implemented on one or more analog integrated circuits (ICs), RF ICs (RFICs), mixed-signal ICs, etc. For example, amplifier 132 through power amplifier 144 in transmitter 130 may be implemented on an RFIC. Driver amplifier 142 and power amplifier 144 may also be implemented on another IC external to the RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

Figure 2:
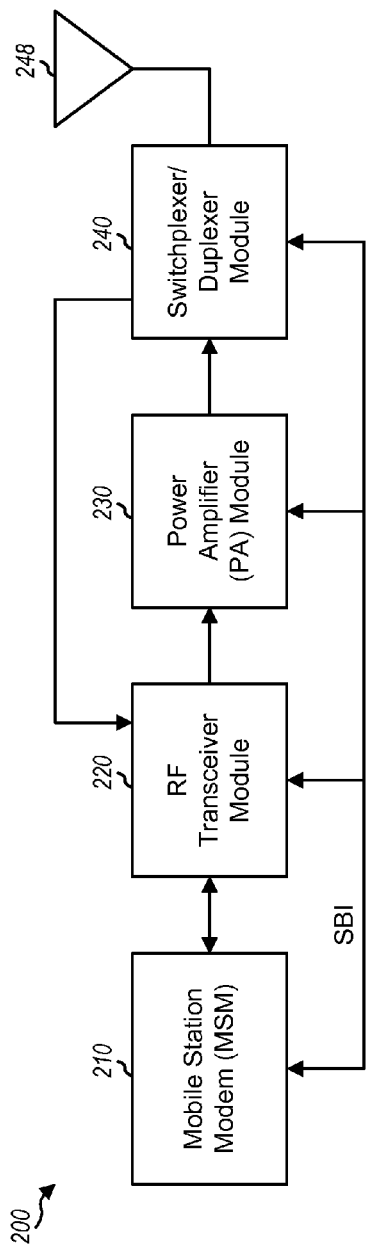
FIG. 2 shows an implementation of the wireless communication device in FIG. 1.

FIG. 2 shows a block diagram of an exemplary design of a wireless device 200, which may be an implementation of wireless device 100 in FIG. 1. In this exemplary design, wireless device 200 includes a mobile station modem (MSM) 210, an RF transceiver (RTR) module 220, a power amplifier (PA) module 230, a switchplexer/duplexer module 240, and an antenna 248. MSM 210 may include digital circuits (e.g., data processor 110 in FIG. 1) that can perform various functions for wireless device 100, e.g., processing for data transmission and reception. MSM 210 may be an ASIC commercially available from Qualcomm Incorporated or some other ASIC. RTR module 220 may include various circuits in a transceiver, e.g., all circuits in transceiver 120 in FIG. 1 except for driver amplifier 142, power amplifier 144, and switches/duplexers 146. RTR module 220 may be an RFIC commercially available from Qualcomm Incorporated or some other RFIC. PA module 230 may include driver amplifier 142 and power amplifier 144 in FIG. 1. Switchplexer/duplexer module 240 may include switches/duplexers 146 in FIG. 1. MSM 210 may communicate with RTR module 220, PA module 230, and module 240 via a serial bus interface (SBI).

FIG. 2 shows an exemplary design of wireless device 200 comprising four different modules that may be manufactured separately. Wireless device 200 may also be implemented with fewer or more modules. For example, RTR module 220 and PA module 230 may be combined into one module. As another example, PA module 230 and switchplexer/duplexer module 240 may also be combined into one module.

Figure 3:
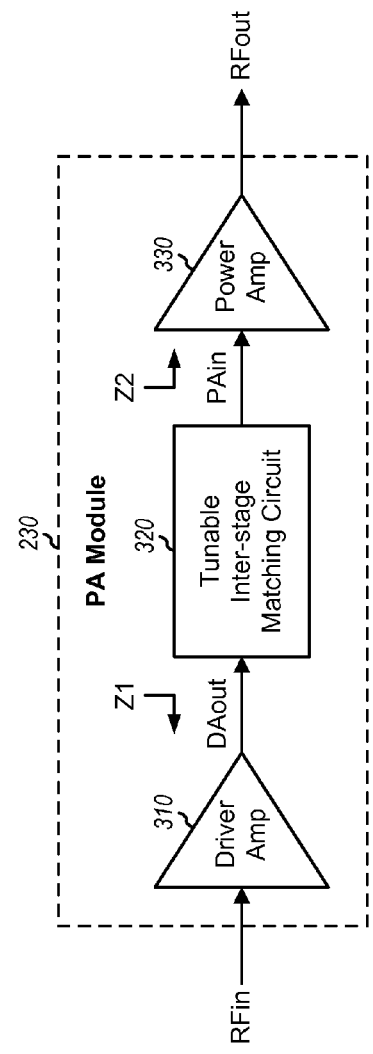
FIG. 3 shows a block diagram of a power amplifier (PA) module.

FIG. 3 shows a block diagram of an exemplary design of PA module 230 in FIG. 2. PA module 230 may be used for driver amplifier 142 and power amplifier 144 in FIG. 1. PA module 230 includes a driver amplifier 310, a tunable inter-stage matching circuit 320, and a power amplifier 330. Driver amplifier 310 receives and amplifies an input RF signal (RFin) and provides an amplified RF signal (DAout). Matching circuit 320 receives the DAout signal and provides a PA input signal (PAin) to power amplifier 330. Matching circuit 320 performs impedance matching between a first impedance (Z1) at the output of driver amplifier 310 and a second impedance (Z2) at the input of power amplifier 330. Z1 may be an intermediate impedance (e.g., 20 to 30 Ohms) whereas Z1 may be a low impedance (e.g., 2 to 4 Ohms). Power amplifier 330 receives and amplifies the PAin signal and provides an output RF signal (RFout).

The development of a PA module, such as PA module 230 in FIG. 3, may be a lengthy process and may involve many design iterations. A challenge in designing a PA module is the difficulty in performing inter-stage impedance matching between driver amplifier 310 and power amplifier 330. This difficulty is due to several reasons. First, the output of driver amplifier 310 and the input of power amplifier 330 are typically internal nodes that are not accessible via external pins. Hence, it may not be possible to perform source-pull or load-pull to measure the impedances at these nodes. Second, inter-stage impedance matching may have high quality factor (Q). Consequently, the performance (e.g., the gain, PAE, and linearity) of the PA module may be very sensitive to impedance mismatch caused by IC process and/or substrate variations. For these and possibly other reasons, it may be difficult to obtain good inter-stage impedance matching.

In an aspect, a digital tunable inter-stage matching circuit may be used to obtain good inter-stage impedance matching. A digital tunable inter-stage matching circuit is an inter-stage matching circuit that can be tuned digitally in discrete steps. A digital tunable inter-stage matching is in contrast to (and may have certain advantages over) an analog tunable inter-stage matching that can be tuned by varying a control voltage. For clarity, a digital tunable inter-stage matching circuit is referred to as simply a tunable inter-stage matching circuit in much of the description below.

The use of a tunable inter-stage matching circuit may result in improved performance in terms of higher gain, higher PAE, better linearity, flatter frequency response, etc. The tunable inter-stage matching circuit may include digitally controlled switches to vary a tunable capacitor and can compensate for impedance mismatch caused by IC process and/or substrate variations. The tunable inter-stage matching circuit may be implemented with various circuit topologies. Some exemplary circuit topologies are described below.

Figure 4A:
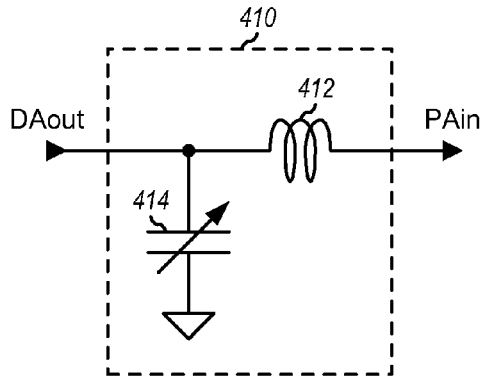
FIGS. 4A and 4B show schematic diagrams of two exemplary designs of a tunable inter-stage matching circuit with a single section.

FIG. 4A shows a schematic diagram of an exemplary design of a tunable inter-stage matching circuit 410 with a single section. Matching circuit 410 includes a series inductor 412 and a shunt tunable capacitor 414. Inductor 412 is coupled between the input and output of matching circuit 410. Tunable capacitor 414 is coupled between the input of matching circuit 410 and circuit ground. Capacitor 414 may be tuned to obtain the desired impedance matching.

Figure 4B:
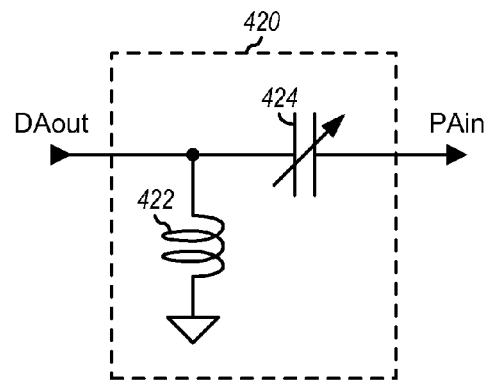

FIG. 4B shows a schematic diagram of an exemplary design of a tunable inter-stage matching circuit 420 with a single section. Matching circuit 420 includes a shunt inductor 422 and a series tunable capacitor 424. Inductor 422 is coupled between the input of matching circuit 420 and circuit ground. Tunable capacitor 424 is coupled between the input and output of matching circuit 420. Capacitor 424 may be tuned to obtain the desired impedance matching.

Figure 5A:
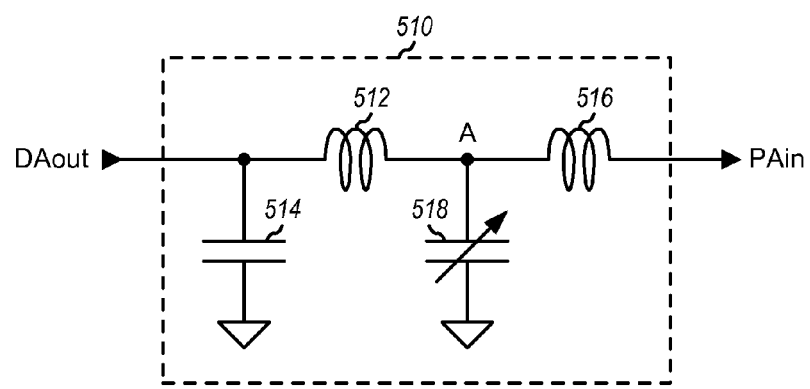
FIGS. 5A to 5D show schematic diagrams of four exemplary designs of a tunable inter-stage matching circuit with two sections.

FIG. 5A shows a schematic diagram of an exemplary design of a tunable inter-stage matching circuit 510 with two sections. Matching circuit 510 includes (i) a first section comprising a series inductor 512 and a shunt capacitor 514 and (ii) a second section comprising a series inductor 516 and a shunt tunable capacitor 518. Inductor 512 is coupled between the input of matching circuit 510 and node A. Capacitor 514 is coupled between the input of matching circuit 510 and circuit ground. Inductor 516 is coupled between node A and the output of matching circuit 510. Capacitor 518 is coupled between node A and circuit ground. Capacitor 518 may be tuned to obtain the desired impedance matching.

Figure 5B:
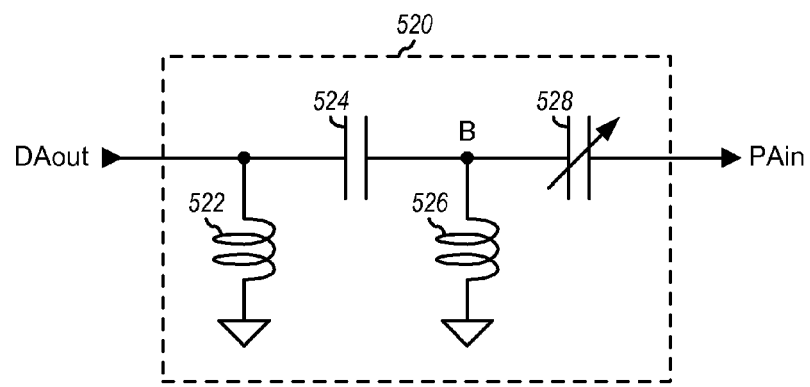

FIG. 5B shows a schematic diagram of an exemplary design of a tunable inter-stage matching circuit 520 with two sections. Matching circuit 520 includes (i) a first section comprising a shunt inductor 522 and a series capacitor 524 and (ii) a second section comprising a shunt inductor 526 and a series tunable capacitor 528. Inductor 522 is coupled between the input of matching circuit 520 and circuit ground. Capacitor 524 is coupled between the input of matching circuit 520 and node B. Inductor 526 is coupled between node B and circuit ground. Capacitor 528 is coupled between node B and the output of matching circuit 520. Capacitor 528 may be tuned to obtain the desired impedance matching.

Figure 5C:
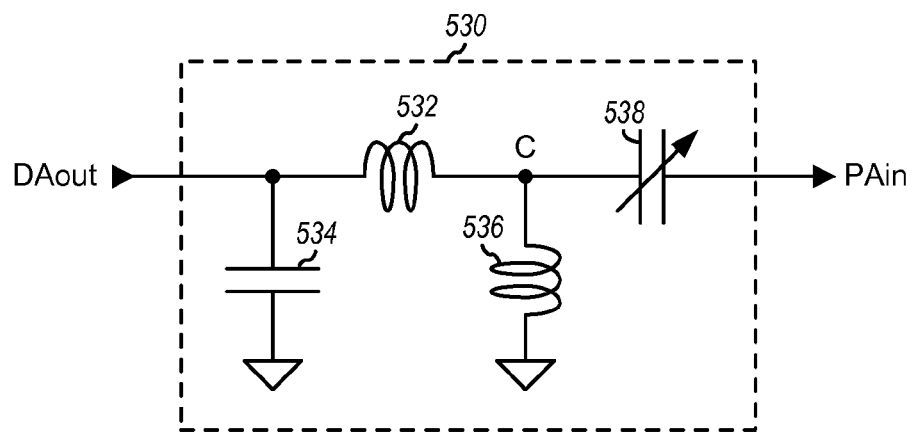

FIG. 5C shows a schematic diagram of an exemplary design of a tunable inter-stage matching circuit 530 with two sections. Matching circuit 530 includes (i) a first section comprising a series inductor 532 and a shunt capacitor 534 and (ii) a second section comprising a shunt inductor 536 and a series tunable capacitor 538. Inductor 532 is coupled between the input of matching circuit 530 and node C. Capacitor 534 is coupled between the input of matching circuit 530 and circuit ground. Inductor 536 is coupled between node C and circuit ground. Capacitor 538 is coupled between node C and the output of matching circuit 530. Capacitor 538 may be tuned to obtain the desired impedance matching.

Figure 5D:
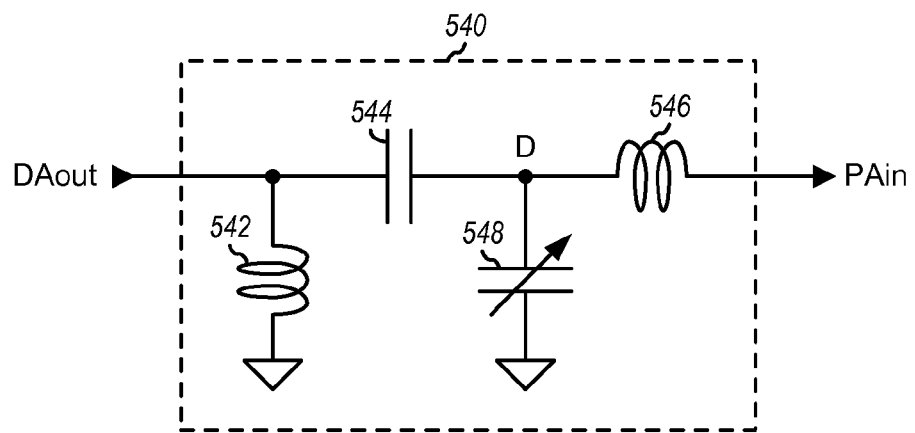

FIG. 5D shows a schematic diagram of an exemplary design of a tunable inter-stage matching circuit 540 with two sections. Matching circuit 540 includes (i) a first section comprising a shunt inductor 542 and a series capacitor 544 and (ii) a second section comprising a series inductor 546 and a shunt tunable capacitor 548. Inductor 542 is coupled between the input of matching circuit 540 and circuit ground. Capacitor 544 is coupled between the input of matching circuit 540 and node D. Inductor 546 is coupled between node D and the output of matching circuit 540. Capacitor 548 is coupled between node D and circuit ground. Capacitor 548 may be tuned to obtain the desired impedance matching.

FIGS. 4A through 5D show exemplary designs of tunable inter-stage matching circuits 410 through 540, each of which may be used for tunable inter-stage matching circuit 320 in FIG. 3. A tunable inter-stage matching circuit may also be implemented in other manners. For example, for the circuit topology shown in FIG. 4A, a capacitor may be coupled in parallel with inductor 412 and may or may not be tunable. As another example, tunable capacitor 414 may be moved from the input to the output of matching circuit 410. Alternatively, another shunt capacitor may be added between the output of matching circuit 410 and circuit ground. The other circuit topologies in FIGS. 4B through 5D may also be implemented with other variations.

In general, a tunable inter-stage matching circuit may include any number of sections, and each section may be implemented with any circuit topology. The tunable inter-stage matching circuit may also include any number of tunable circuit components. Each tunable circuit component may be a tunable capacitor, a tunable inductor, etc. FIGS. 5A through 5D show exemplary designs of tunable inter-stage matching circuits with one tunable capacitor in the second/output section. It may be desirable to tune the second section since it is closer to the power amplifier, which typically has a low input impedance. A tunable capacitor may also be used in the first section (e.g., instead of the second section) or in each section.

Figure 6A:
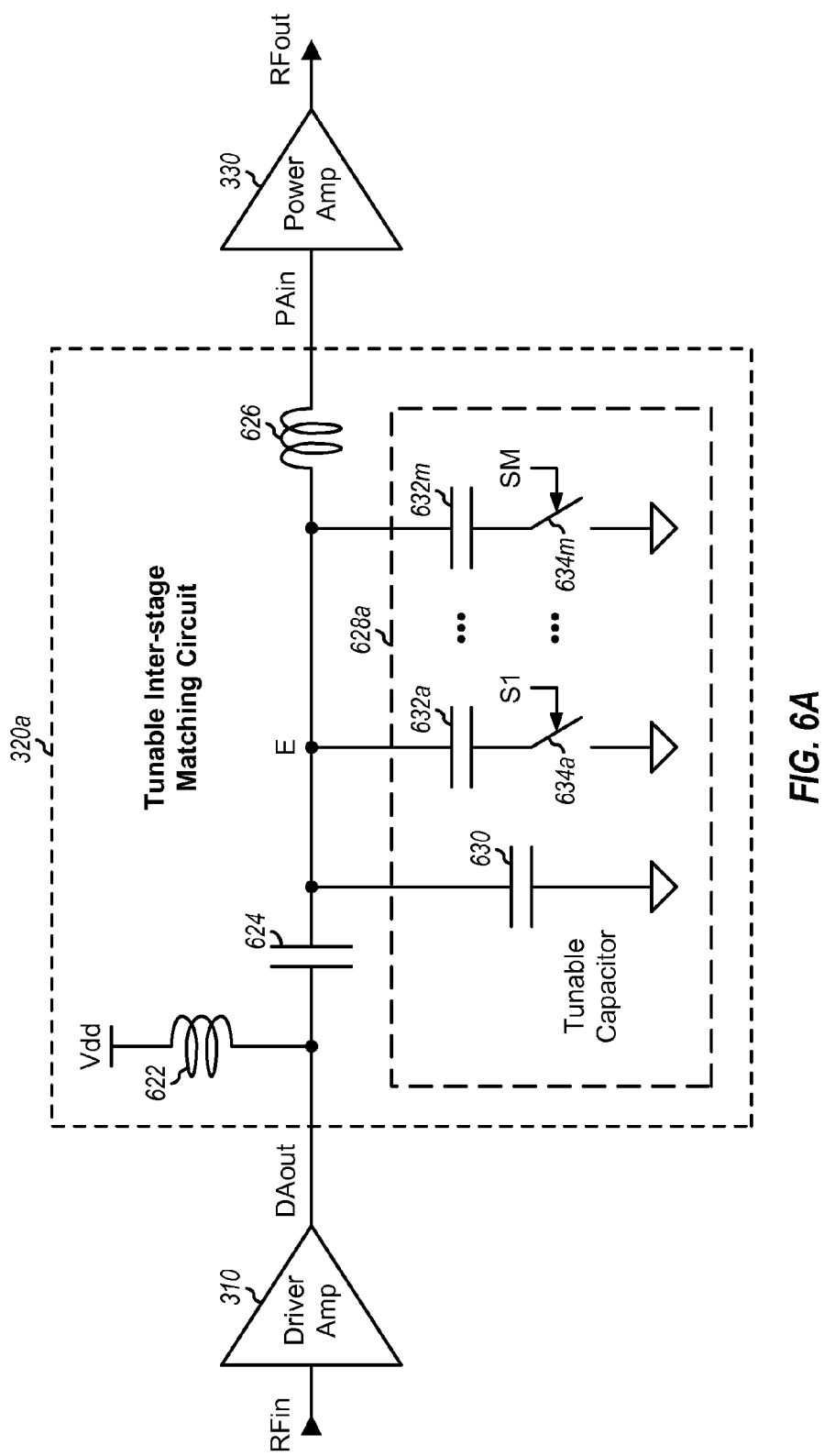
FIGS. 6A and 6B show schematic diagrams of two exemplary designs of a tunable inter-stage matching circuit with a tunable capacitor.

FIG. 6A shows a schematic diagram of an exemplary design of a tunable inter-stage matching circuit 320a with a tunable capacitor implemented with switchable capacitors. Within matching circuit 320a, an inductor 622 is coupled between the input of matching circuit 320a and a power supply (Vdd). A capacitor 624 is coupled between the input of matching circuit 320a and node E. An inductor 626 is coupled between node E and the output of matching circuit 320a. A tunable capacitor 628a is coupled between node E and circuit ground.

In the exemplary design shown in FIG. 6A, tunable capacitor 628a is implemented with a fixed capacitor 630 and a bank of M switchable capacitors 632a through 632m, where M may be any value. Capacitor 630 is coupled between node E and circuit ground. Each switchable capacitor 632 is coupled in series with an associated switch 634. The top end of each capacitor 632 is coupled to node E. The bottom end of each switch 634 is coupled to circuit ground. Switches 634a through 634m receive M control signals 51 through SM, respectively. Each switch 634 may be opened or closed based on its associated control signal.

Matching circuit 320a can implement the single-section circuit topology shown in FIG. 4A. In this case, inductor 622 may be a large load inductor/RF choke for driver amplifier 310, and capacitor 624 may be a large AC coupling/DC blocking capacitor. The combination of series inductor 626 and shunt tunable capacitor 628a can provide the desired impedance matching between driver amplifier 310 and power amplifier 330. Matching circuit 320a can also implement the two-section circuit topology shown in FIG. 5D. In this case, inductor 622 and capacitor 624 may be part of the matching circuit.

Figure 6B:
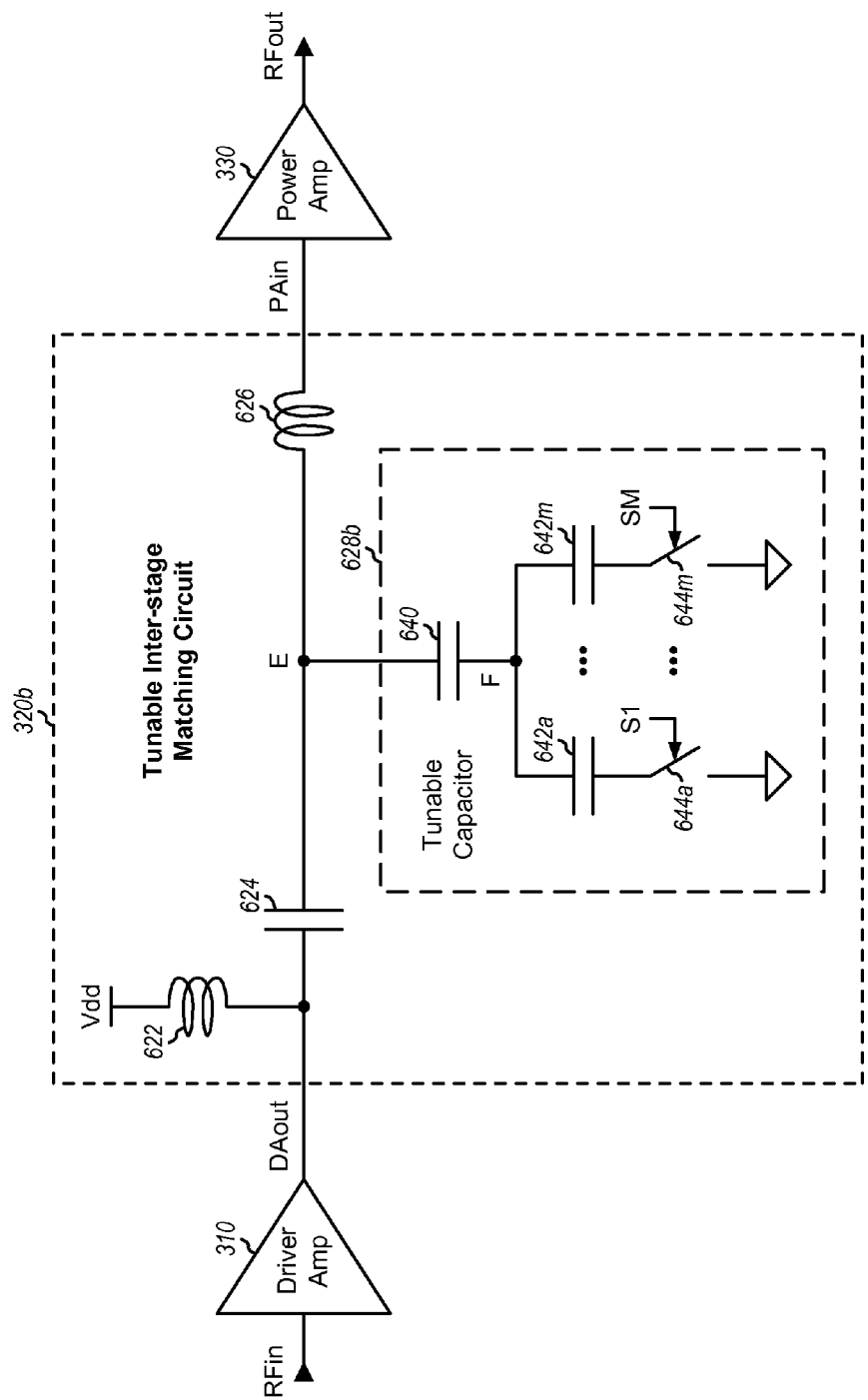

FIG. 6B shows a schematic diagram of an exemplary design of a tunable inter-stage matching circuit 320b with a tunable capacitor implemented with switchable capacitors. Matching circuit 320b includes inductors 622 and 626 and capacitor 624, which are coupled as described above for FIG. 6A. Matching circuit 320b further includes a tunable capacitor 628b in place of tunable capacitor 628a. Tunable capacitor 628b is implemented with a fixed capacitor 640 and a bank of M switchable capacitors 642a through 642m. Capacitor 640 is coupled between node E and node F. Each switchable capacitor 642 is coupled in series with an associated switch 644. The top end of each capacitor 642 is coupled to node F. The bottom end of each switch 644 is coupled to circuit ground.

As shown by the exemplary designs in FIGS. 6A and 6B, a tunable capacitor may be implemented with a fixed capacitor and a bank of switchable capacitors. Each switchable capacitor may be selected by closing the associated switch or may be unselected by opening the switch.

Using switches in series with the switchable capacitors may increase resistance and lower the Q of the matching circuit. The adverse impact on Q may be mitigated by partitioning the total capacitance of the tunable capacitor into a fixed portion and a tunable portion. In most cases, a tunable portion that covers 20 to 30% of the total capacitance may be sufficient to compensate for most type of variations. The total capacitance of switchable capacitors 632a through 632m in FIG. 6A may thus be one third to one fifth of the total capacitance of tunable capacitor 628a and may then have smaller impact on the Q of the inter-stage matching. Furthermore, the inter-stage matching can typically tolerate some losses due to the switches since the power level observed by the matching circuit is typically 10 decibels (dB) lower than the power level at the output of the power amplifier. In an exemplary design that is shown in FIGS. 6A and 6B, the switches may be placed between the bottom of the switchable capacitors and circuit ground. This exemplary design may result in the parasitic capacitances of the switches having less impact on impedance matching when the switches are turned off.

In general, a tunable capacitor may include any number of switchable capacitors, which may be coupled based on any configuration. In an exemplary design, the M switchable capacitors may have binary weighted capacitance values. In this exemplary design, the first switchable capacitor may have a capacitance of C, the second switchable capacitor may have a capacitance of 2° C., the third switchable capacitor may have a capacitance of 4° C., etc. In another exemplary design, the M switchable capacitors may have equal capacitance. In this exemplary design, each switchable capacitor may have a capacitance of C. The M switchable capacitors may also be implemented in other manners. The total capacitance of the M switchable capacitors may be selected to obtain the desired tuning for inter-stage impedance matching.

Figure 7A:
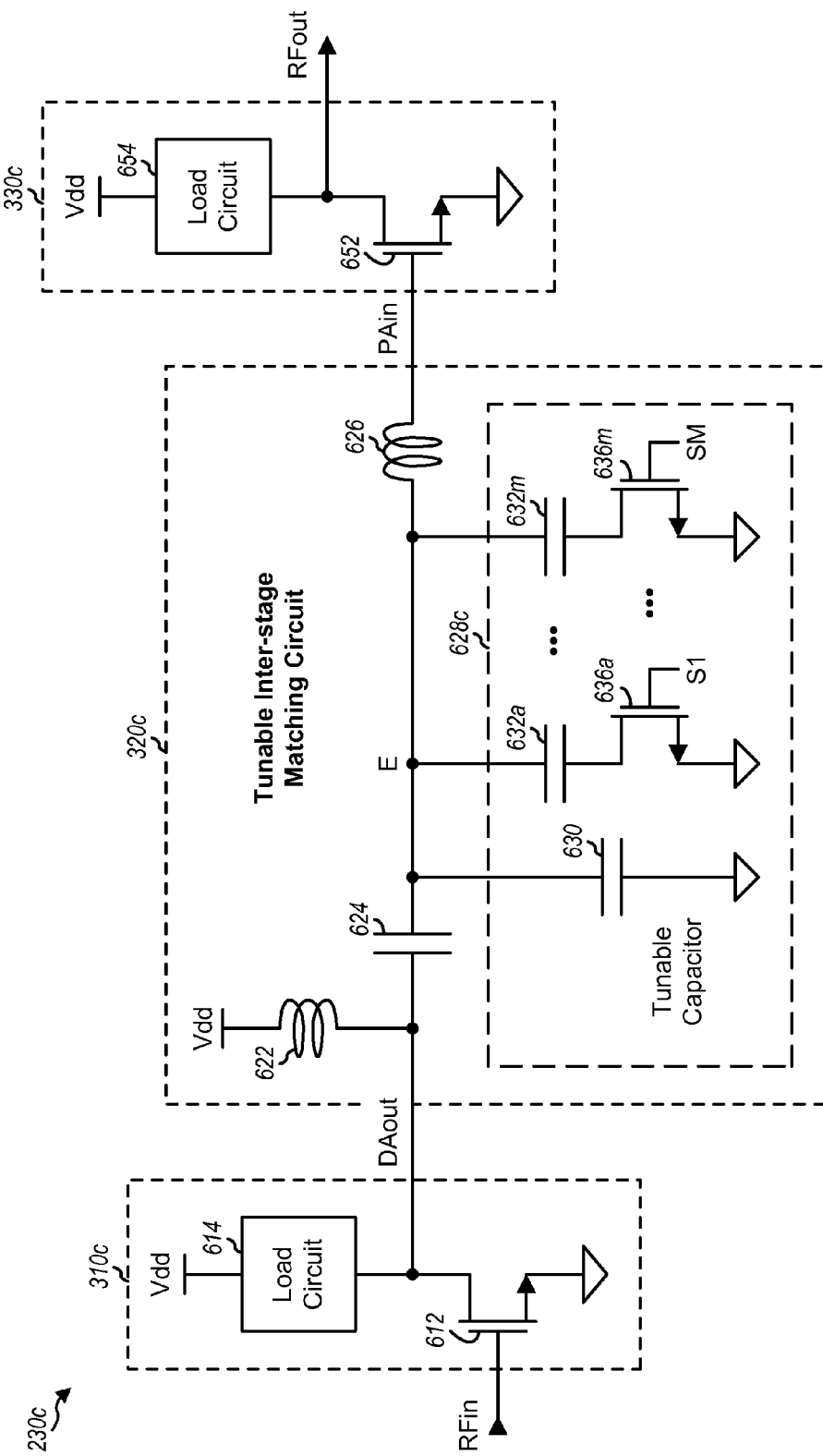
FIGS. 7A and 7B show schematic diagrams of two exemplary designs of a PA module with a tunable inter-stage matching circuit.

FIG. 7A shows a schematic diagram of a PA module 230c, which is an exemplary design of PA module 230 in FIG. 2. PA module 230c includes a driver amplifier 310c, a tunable inter-stage matching circuit 320c, and a power amplifier 330c, which are exemplary designs of the corresponding circuits in PA module 230 in FIG. 2.

Within driver amplifier 310c, an N-channel metal oxide semiconductor (NMOS) transistor 612 has its gate receiving the RFin signal, its source coupled to circuit ground, and its drain providing the DAout signal. A load circuit 614 is coupled between the Vdd supply and the drain of NMOS transistor 612. Load circuit 614 may also be omitted, and inductor 622 in matching circuit 320c may act as a load inductor for driver amplifier 310c.

Within power amplifier 330c, an NMOS transistor 652 has its gate receiving the PAin signal, its source coupled to circuit ground, and its drain providing the RFout signal. A load circuit 654 is coupled between the Vdd supply and the drain of NMOS transistor 652. Load circuit 654 may include one or more inductors, capacitors, MOS transistors, etc.

Tunable inter-stage matching circuit 320c includes inductors 622 and 626 and capacitor 624, which are coupled as described above for FIG. 6A. Matching circuit 320c further includes a tunable capacitor 628c in place of tunable capacitor 628a in FIG. 6A. Tunable capacitor 628c includes fixed capacitor 630 and M switchable capacitors 642a through 642m coupled in series with M NMOS transistors 636a through 636m, respectively. Each NMOS transistor 636x, where $x \in \{a, \ldots, m\}$, has its gate receiving a respective control signal, its source coupled to circuit ground, and its drain coupled to the bottom plate of the associated capacitor 632x. Each NMOS transistor 636x may be (i) turned on with the associated control signal Sx at logic high to select the associated capacitor 632x or (ii) turned off with control signal Sx at logic low to unselect the associated capacitor 632x.

As shown in FIG. 7A, a set of M digital control signals S1 through SM may be used to individually turn on or off each NMOS transistor 636 to obtain the desired total capacitance for tunable capacitor 628c. The M control signals may be generated based on a control sent to the PA module via SBI. The use of SBI may simplify the interface to control the switches in the tunable capacitor. SBI may be readily supported by a PA module implemented with complementary metal oxide semiconductor (CMOS).

Figure 7B:
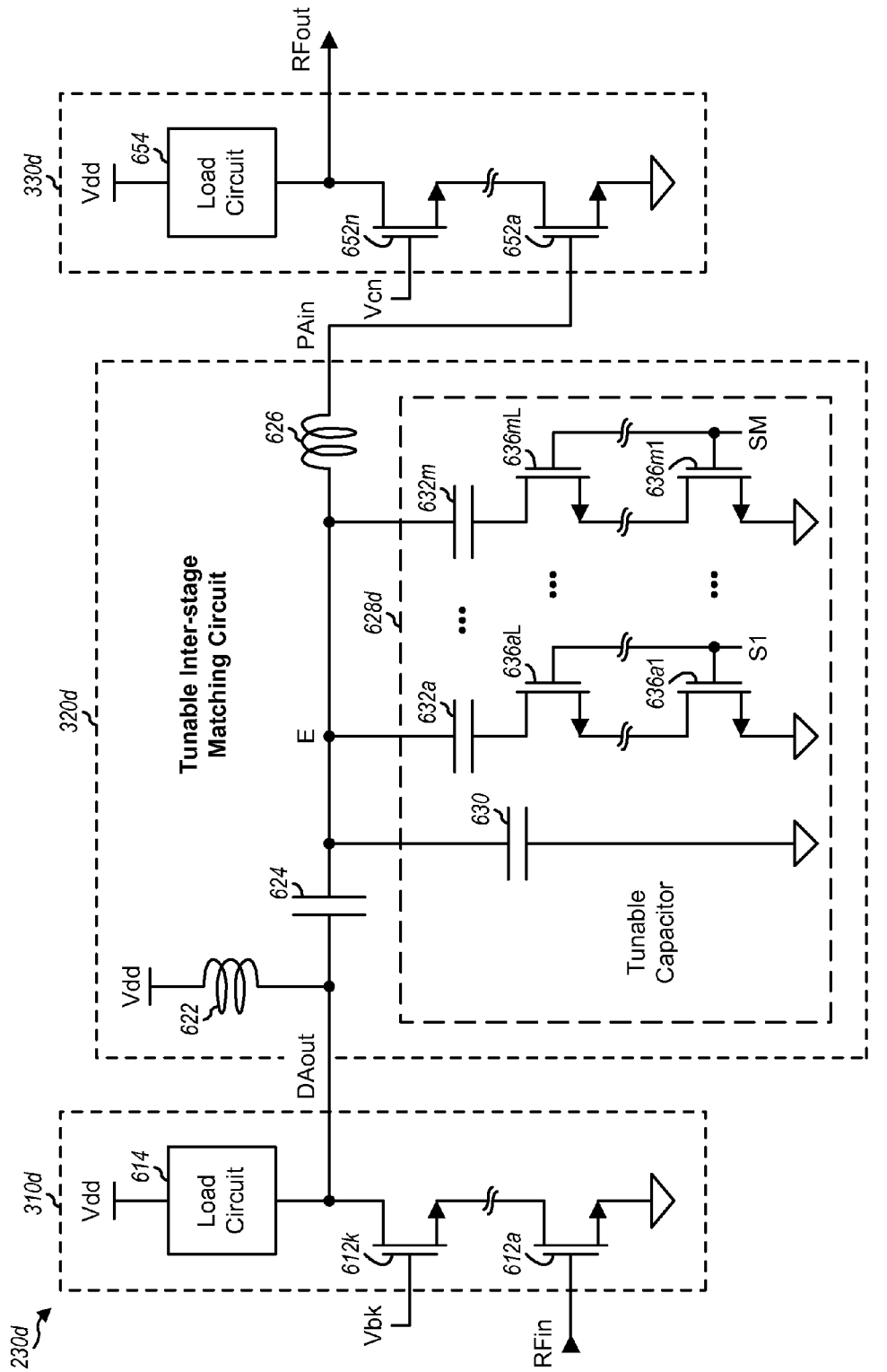

FIG. 7B shows a schematic diagram of a PA module 230d, which is another exemplary design of PA module 230 in FIG. 2. PA module 230d includes a driver amplifier 310d, a tunable inter-stage matching circuit 320d, and a power amplifier 330d, which are exemplary designs of the corresponding circuits in PA module 230 in FIG. 2.

Within driver amplifier 310d, K NMOS transistors 612a through 612k may be coupled in a stack, where K may be one or greater. The bottommost NMOS transistor 612a has its gate receiving the RFin signal and its source coupled to circuit ground. Each remaining NMOS transistor 612i, for $i \in \{b, \ldots, k\}$, in the stack has its gate receiving a respective bias voltage (Vbi) and its source coupled to the drain of the NMOS transistor 612 below. The topmost NMOS transistor 612k has its drain providing the DAout signal. Load circuit 614 is coupled between the Vdd supply and the drain of the topmost NMOS transistor 612k. Load circuit 614 may also be omitted.

Within power amplifier 330d, N NMOS transistors 652a through 652n may be coupled in a stack, where N may be two or greater. The bottommost NMOS transistor 652a has its gate receiving the PAin signal and its source coupled to circuit ground. Each remaining NMOS transistor 652j, for $j \in \{b, \ldots, n\}$, in the stack has its gate receiving a respective bias voltage (Vcj) and its source coupled to the drain of the NMOS transistor 652 below. The topmost NMOS transistor 652n has its drain providing the RFout signal. Load circuit 654 is coupled between the Vdd supply and the drain of the topmost NMOS transistor 652n.

Tunable inter-stage matching circuit 320d includes inductors 622 and 626 and capacitor 624 and further includes a tunable capacitor 628d in place of tunable capacitor 628c in FIG. 7A. Tunable capacitor 628d includes fixed capacitor 630 and M switchable capacitors 632a through 632m. Each switchable capacitor 632x, for $x \in \{a, \ldots, m\}$, is coupled in series with a stack of L NMOS transistors 636x1 through 636xL, where L may be two or greater. The L NMOS transistors 636x1 through 636xL in the stack receive the same control signal and may be (i) turned on to select the associated capacitor 632x or (ii) turned off to unselect the associated capacitor 632x.

The RFout signal from power amplifier 330d may have a large voltage swing, which may exceed the breakdown voltage of each NMOS transistor 652j, where $j \in \{a, \ldots, n\}$. The voltage swing of the RFout signal may be split or distributed approximately equally across the N NMOS transistors 652a through 652n. Each NMOS transistor 652j may then observe only a fraction of the voltage swing, which should be less than the breakdown voltage of the NMOS transistor to achieve good reliability. The use of stacked transistors is especially desirable for high frequency amplifiers implemented with transistors fabricated with deep sub-micron IC processes and having low breakdown voltages. The stacked transistors can essentially multiply the breakdown voltage to improve reliability. Stacked NMOS transistors 636x1 through 636xL, where $x \in \{a, \ldots, m\}$, may be used for each switch in tunable capacitor 628d to distribute the voltage swing across the NMOS transistors.

NMOS transistors 636 used for switches in FIGS. 7A and 7B may be designed with suitable dimensions to obtain the desired performance. In particular, NMOS transistors 636 may be sufficiently large to reduce resistance when turned on and to mitigate adverse impact to the Q of the tunable inter-stage matching circuit.

FIGS. 7A and 7B show exemplary designs in which switches for selecting and unselecting switchable capacitors are implemented with NMOS transistors. The switches may also be implemented with P-channel metal oxide semiconductor (PMOS) transistors, or some other types of transistors, or some other circuit components. Switches implemented with NMOS transistors may have lower loss than switches implemented with PMOS transistors, for the same transistor area, due to higher mobility for NMOS transistors. The switches may also be fabricated with silicon-on-insulator (SOI), which is an IC process in which a thin layer of silicon is formed on top of an insulator such as silicon oxide or glass. MOS transistors for switches may then be built on top of this thin layer of silicon. The SOI process may reduce parasitic capacitances of the switches, which may be able to operate faster. The switches may also be fabricated with other IC process technologies.

NMOS transistor 652 in power amplifier 330c in FIG. 7A and NMOS transistor 652a in power amplifier 330d in FIG. 7B may be large transistors in order to provide high output power for the RFout signal. A large NMOS transistor may have large input capacitance, which may vary by a large amount and in a nonlinear fashion versus gate voltage. The nonlinear input capacitance of the NMOS transistor may result in distortion, which may adversely impact the linearity of the power amplifier.

Figure 8:
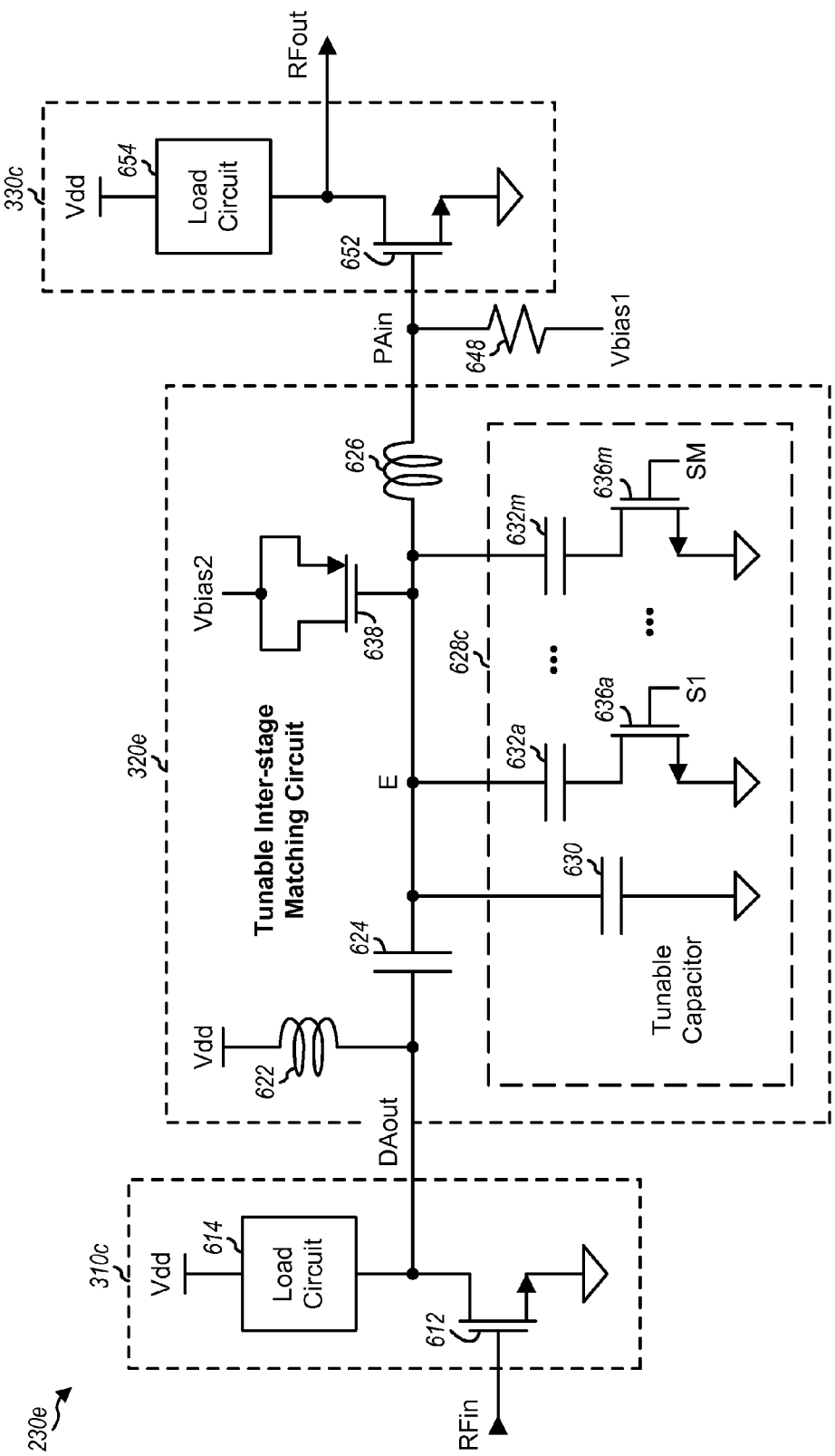
FIG. 8 shows a schematic diagram of an exemplary design of a PA module with compensation for variable PA input capacitance.

FIG. 8 shows a schematic diagram of a PA module 230e with compensation for variable PA input capacitance. PA module 230e includes driver amplifier 310c, a tunable inter-stage matching circuit 320e, and power amplifier 330c. Matching circuit 320e includes inductors 622 and 626, capacitor 624, and tunable capacitor 628c in FIG. 7A. Matching circuit 320e further includes a PMOS transistor 638, which is used to compensate for the nonlinear input capacitance of NMOS transistor 652 in power amplifier 230c. PMOS transistor 638 has its gate coupled to node E and its source and drain coupled together and receiving a Vbias2 voltage. A resistor 648 has one end coupled to the gate of NMOS transistor 652 and the other end receiving a Vbias1 voltage.

In general, a power amplifier may include a first transistor of a first type (e.g., an NMOS transistor) that receives and amplifies the PAin signal. A tunable inter-stage matching circuit may include a second transistor (e.g., a PMOS transistor) of a second type that is different from the first type. The first and second transistors may each have input capacitance that varies with the power level of the PAin signal. The first transistor may have a first capacitance-to-voltage (CV) curve, and the second transistor may have a second CV curve that is approximately reversed of the first CV curve. The second transistor may be able to compensate for changes in the input capacitance of the first transistor with PAin signal level. This compensation may reduce distortion and improve linearity of the power amplifier.

FIGS. 6A to 8 show some exemplary designs of PA modules with tunable inter-stage matching circuits. A tunable inter-stage matching circuit may also be implemented in other manners, e.g., with other circuit topologies, with other implementations of the switches, etc.

A tunable inter-stage matching circuit may include a tunable capacitor comprising M switchable capacitors coupled in series with M switches. The tunable capacitor may be set to one of a plurality of discrete capacitance values, which may correspond to a plurality of tune codes. Each tune code may be associated with a specific setting for the M switches and a specific discrete capacitance value for the tunable capacitor.

In an exemplary design, calibration may be performed to tune a tunable inter-stage matching circuit to obtain good performance for a PA module. Calibration may be performed in the factory during manufacturing and/or in the field. Calibration may be performed in various manners.

In an exemplary design, calibration may be performed to obtain the best performance for a PA module at a target frequency. The best performance may be quantified by the highest RFout signal level (as described below) or based on some other metrics. For calibration, a fixed RFin signal at the target frequency may be applied to the PA module. The tunable inter-stage matching circuit may then be tuned by cycling through the plurality of tune codes and measuring the RFout signal level for each tune code. The tune code that provides the highest RFout signal level may be selected, and the tunable inter-stage matching circuit may be operated with the discrete capacitance value corresponding to the selected tune code.

In another exemplary design, calibration may be performed to obtain a constant RFout signal level from the PA module for different frequencies. For calibration, an RFin signal at a particular frequency may be applied to the PA module. The tunable inter-stage matching circuit may then be tuned by cycling through the plurality of tune codes and measuring the RFout signal level for each tune code until a target RFout signal level is obtained from the PA module. The process may be repeated for each frequency of interest. For each frequency, the tune code that provides the target RFout signal level may be saved. Thereafter, the PA module may be operated at a particular frequency. The tunable inter-stage matching circuit may be operated with the discrete capacitance value corresponding to the saved tune code for the particular operating frequency.

Calibration may also be performed in other manners. For example, calibration may be performed to determine the best performance for the PA module at different RFout signal levels, e.g., at 0, 10, 20, 30 dBm, etc. For each RFout signal level, the tune code that provides the highest signal level may be determined and saved. Thereafter, a suitable tune code may be applied to the tunable inter-stage matching circuit based on the RFout signal level from the PA module.

The tunable inter-stage matching circuit may also be used to change the performance of the power amplifier to meet certain requirements. For example, if the power amplifier has more than sufficient gain, then the tunable inter-stage matching circuit may be tuned slightly off to reduce the gain of the power amplifier and improve linearity.

The tunable inter-stage matching circuit may improve the performance of the PA module. The switchable capacitors in the tunable inter-stage matching circuit may be tuned via the S1 through SM control signals to adjust inter-stage impedance matching between the driver amplifier and the power amplifier. This tuning can compensate for impedance mismatch caused by IC process and/or substrate variations.

Computer simulation was performed for a PA module with a fixed inter-stage matching circuit and a PA module with a tunable inter-stage matching circuit. The computer simulation shows that the tunable inter-stage matching circuit can improve the performance of the PA module.

Figure 9:
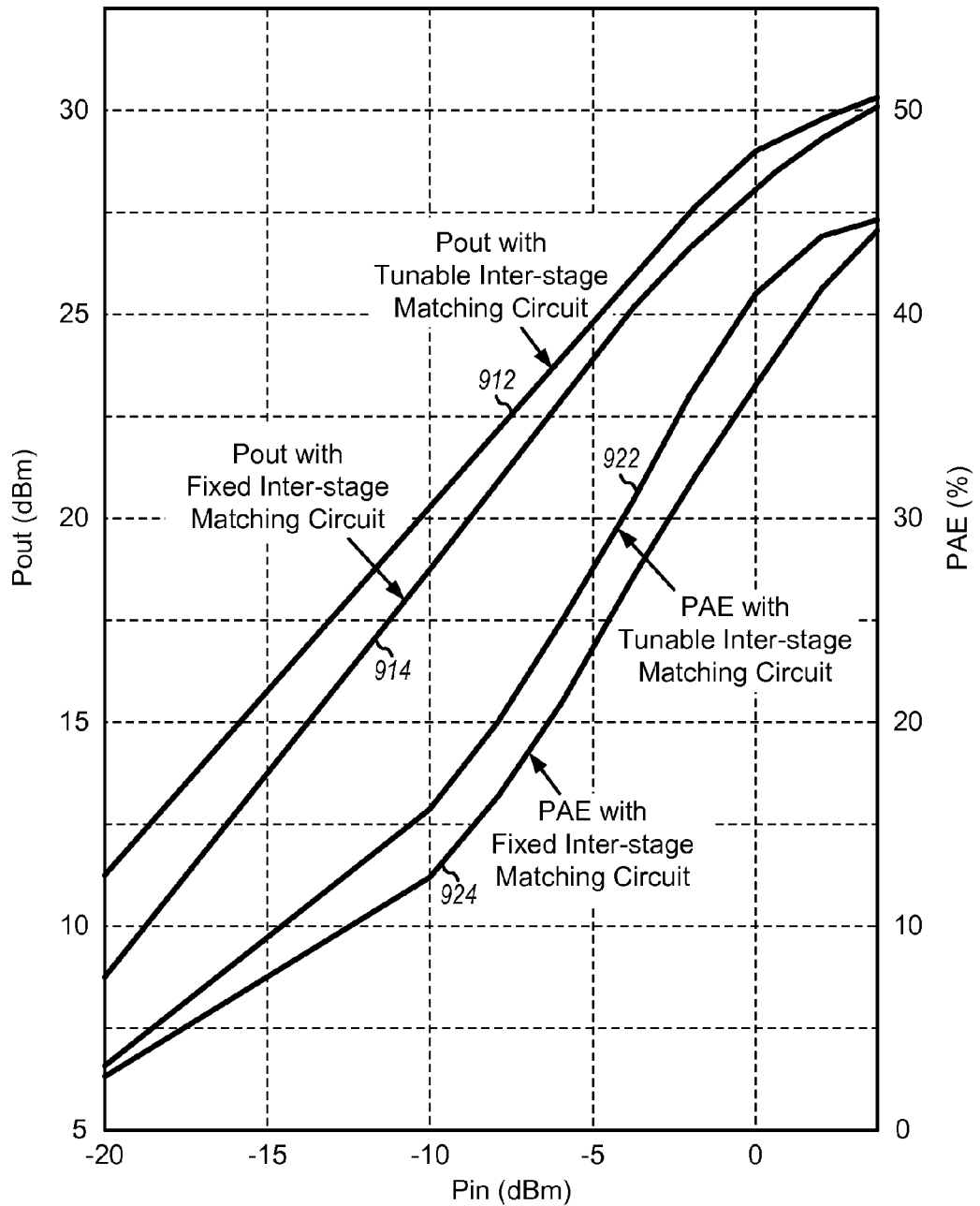
FIG. 9 shows plots of the performance of a PA module with a tunable inter-stage matching circuit and a PA module with a fixed inter-stage matching circuit.

FIG. 9 shows plots of the performance of a PA module with a fixed inter-stage matching circuit and a PA module with a tunable inter-stage matching circuit. In FIG. 9, the horizontal axis denotes the signal level of the PAin signal (Pin), which is given in units of dBm. The left vertical axis denotes the signal level of the RFout signal (Pout), which is also given in units of dBm. The right vertical axis denotes PAE, which is given in units of percent (%).

A plot 912 shows the RFout signal level for the PA module with the tunable inter-stage matching circuit. A plot 914 shows the RFout signal level for the PA module with the fixed inter-stage matching circuit. Plots 912 and 914 indicate that the gain and output power level of a power amplifier may be improved with the tunable inter-stage matching circuit.

A plot 922 shows the PAE of the PA module with the tunable inter-stage matching circuit. A plot 924 shows the PAE of the PA module with the fixed inter-stage matching circuit. Plots 922 and 924 indicate that the PAE of a power amplifier may be improved with the tunable inter-stage matching circuit.

In an exemplary design, an apparatus (e.g., a wireless device, an integrated circuit, etc.) may comprise first and second active circuits and a tunable inter-stage matching circuit. The first active circuit may receive a first signal and provide a second signal. The second active circuit may receive a third signal and provide a fourth signal. The tunable inter-stage matching circuit may be coupled between the first and second active circuits and may receive the second signal and provide the third signal. The tunable inter-stage matching circuit may comprise a tunable capacitor that can be varied in discrete steps to adjust impedance matching between the first and second active circuits.

In an exemplary design, the first active circuit may comprise a driver amplifier, and the second active circuit may comprise a power amplifier. The first and second active circuits may also comprise other types of circuits. For example, the first or second active circuit may comprise a mixer. In an exemplary design, the first and second active circuits may be implemented with MOS transistors.

In an exemplary design, the tunable inter-stage matching circuit may further comprise an inductor coupled between a first node within the matching circuit and an output of the matching circuit. The tunable capacitor may be coupled between the first node and circuit ground. The tunable inter-stage matching circuit may also be implemented with other circuit topology.

In an exemplary design, the tunable capacitor may comprise (i) a plurality of capacitors coupled in parallel and (ii) a plurality of switches coupled to the plurality of capacitors, one switch for each capacitor, e.g., as shown in FIG. 6A or 6B. Each switch may be turned on to select an associated capacitor or turned off to unselect the associated capacitor. The tunable capacitor may further comprise a fixed capacitor that may be selected at all times and may be coupled (i) in parallel with the plurality of capacitors (e.g., as shown in FIG. 6A) or (ii) in series with the plurality of capacitors (e.g., as shown in FIG. 6B). In an exemplary design, each switch may be coupled between the bottom plate of the associated capacitor and circuit ground. Each switch may be implemented with at least one MOS transistor, e.g., with a plurality of NMOS transistors coupled in a stack to handle high signal level.

In an exemplary design, the second active circuit may comprise a first transistor of a first type (e.g., an NMOS transistor) to receive the third signal. The tunable inter-stage matching circuit may comprise a second transistor (e.g., a PMOS transistor) of a second type that is different from the first type, e.g., as shown in FIG. 8. The second transistor may compensate for variations in the input capacitance of the first transistor.

The output of the first active circuit and the input of the second active circuit may be internal nodes and may be inaccessible via internal pins. The tunable capacitor may be set to one of a plurality of discrete capacitance values based on a control, which may be received via an SBI. For example, the tunable capacitor may be set to a discrete capacitance value that is associated with the highest output power level or a target output power level among a plurality of possible discrete capacitance values for the tunable capacitor. This discrete capacitance value may be determined by calibration or via some other means.

In another exemplary design, an integrated circuit may comprise a driver amplifier, a tunable inter-stage matching circuit, and a power amplifier. The driver amplifier may receive and amplify a first RF signal and provide a second RF signal. The power amplifier may receive and amplify a third RF signal and provide a fourth RF signal. The tunable inter-stage matching circuit may be coupled between the driver amplifier and the power amplifier and may receive the second RF signal and provide the third RF signal. The tunable inter-stage matching circuit may comprise a tunable capacitor that may be varied in discrete steps to adjust impedance matching between the driver amplifier and the power amplifier.

In an exemplary design, the driver amplifier and the power amplifier may be implemented with MOS transistors. The driver amplifier may comprise at least one NMOS transistor coupled in a stack. The power amplifier may comprise a plurality of NMOS transistors coupled in a stack.

The tunable capacitor may comprise (i) a plurality of capacitors coupled in parallel and (ii) a plurality of switches coupled to the plurality of capacitors, one switch for each capacitor. Each switch may be turned on to select an associated capacitor or turned off to unselect the associated capacitor. The tunable capacitor may further comprise a fixed capacitor coupled in parallel with the plurality of capacitors and selected at all times. The switches may be implemented with MOS transistors.

Figure 10:
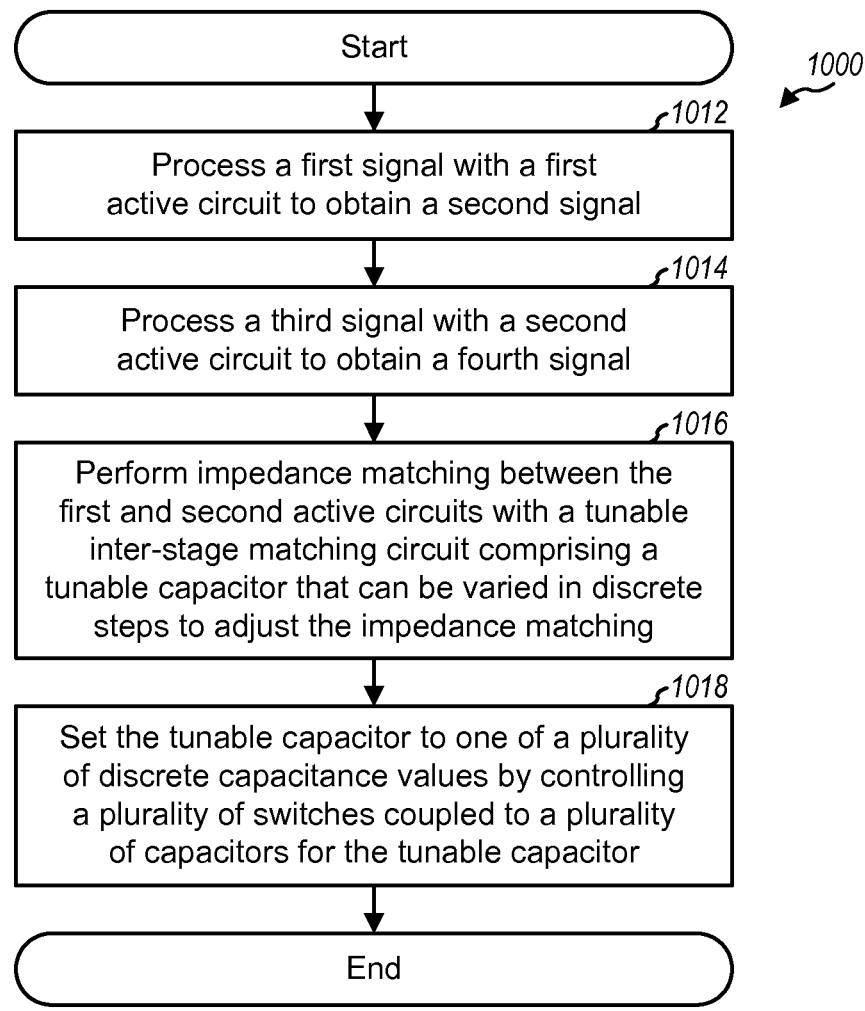
FIG. 10 shows a process for performing signal processing.

FIG. 10 shows an exemplary design of a process 1000 for performing signal processing. A first signal may be processed with a first active circuit to obtain a second signal (block 1012). A third signal may be processed with a second active circuit to obtain a fourth signal (block 1014). In an exemplary design of block 1012, the first signal may be amplified with a driver amplifier to obtain the second signal. In an exemplary design of block 1014, the third signal may be amplified with a power amplifier to obtain the fourth signal.

Impedance matching between the first and second active circuits may be performed with a tunable inter-stage matching circuit comprising a tunable capacitor that can be varied in discrete steps to adjust the impedance matching (block 1016). The tunable capacitor may be set to one of a plurality of discrete capacitance values by controlling a plurality of switches coupled to a plurality of capacitors for the tunable capacitor (block 1018).

The tunable inter-stage matching circuit and PA module described herein may be implemented on an IC, an analog IC, an RFIC, a mixed-signal IC, an ASIC, a printed circuit board (PCB), an electronic device, etc. The tunable inter-stage matching circuit and PA module may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the tunable inter-stage matching circuit and PA module described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC, (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a driver amplifier;
a power amplifier;
an inter-stage matching circuit tunable in discrete steps for matching impedances between the driver amplifier and the power amplifier, the tunable inter-stage matching circuit including a bank of capacitors, a fixed capacitor coupled in series between the driver amplifier and the bank of capacitors, and a first inductor coupled to and in series between the power amplifier and the bank of capacitors, each capacitor of the bank coupled in series with a switch for coupling the capacitor to a ground voltage; and
a second inductor coupled between the driver amplifier and the inter-stage matching circuit and the first inductor coupled between the inter-stage matching circuit and the power amplifier.

2. The apparatus of claim 1, the inter-stage matching circuit further comprising a fixed capacitor coupled in parallel with each capacitor of the bank.

3. The apparatus of claim 1, each switch of a plurality of switches configured for coupling an associated capacitor to the ground voltage or decoupling the associated capacitor from the ground voltage based on a received control signal.

4. The apparatus of claim 1, further comprising the fixed capacitor coupled between the first inductor and the inter-stage matching circuit.

5. The apparatus of claim 1, the inter-stage matching circuit further comprising a switch coupled between the bank of capacitors and a bias voltage.

6. The apparatus of claim 1, each of the driver amplifier, the power amplifier, and the inter-stage matching circuit implemented on a common integrated circuit.

7. The apparatus of claim 2, the fixed capacitor coupled in series with the bank of switchable capacitors.

8. The apparatus of claim 2, the fixed capacitor coupled n parallel with the bank of switchable capacitors.

9. The apparatus of claim 1, each switch of a plurality of switches implemented with at least one metal oxide semiconductor (MOS) transistor.

10. The apparatus of claim 1, the bank of switchable capacitors comprising switchable capacitors having either binary weighted capacitance values or equal capacitance values.

11. The apparatus of claim 1, each capacitor of the bank of switchable capacitors coupled to a stack of one or more transistors.

12. A method, comprising:
receiving a signal from a first circuit and conveying another signal to a second circuit; and
matching an impedance between the first circuit and the second circuit with an inter-stage matching circuit tunable in discrete steps and comprising a plurality of switchable capacitors in a parallel configuration, a fixed capacitor coupled in series between the first circuit and the bank of capacitors, and a first inductor coupled to and in series between the second circuit and the plurality of switchable capacitors, each switchable capacitor configured to be coupled to a ground voltage via a switchable element, and a second inductor coupled between the first circuit and the inter-stage matching circuit and the first inductor coupled between the inter-stage matching circuit and the second circuit.

13. The method of claim 12, the matching comprising setting a tunable capacitor to one of a plurality of discrete capacitance values by controlling a plurality of switchable elements coupled to a plurality of capacitors of the tunable capacitor.

14. The method of claim 12, further comprising conveying one or more control signals to one or more switchable elements of the plurality of switchable elements for configuring the one or more switchable elements.

15. The method of claim 12, the matching comprising tuning a tunable capacitor to one of a plurality of discrete capacitance values by at least one of coupling one or more capacitors of a bank of capacitors to a ground voltage and decoupling the one or more capacitors of the bank of capacitors from the ground voltage to match an impedance between the first circuit and the second circuit.

16. The method of claim 15, the tuning comprising at least one of closing one or more switches to couple the one or more capacitors to the ground voltage or opening one or more switches to decouple the one or more capacitors from the ground voltage.

17. A device comprising:
means for receiving a signal from a first circuit and conveying another signal to a second circuit; and
means for matching an impedance between the first circuit and the second circuit with an inter-stage matching circuit tunable in discrete steps and comprising a plurality of switchable capacitors in a parallel configuration, a fixed capacitor coupled in series between the first circuit and the bank of capacitors, and a first inductor coupled to and in series between the second circuit and the plurality of switchable capacitors, each switchable capacitor configured to be coupled to a ground voltage via a switchable element, and a second inductor coupled between the first circuit and the inter-stage matching circuit and the first inductor coupled between the inter-stage matching circuit and the second circuit.

18. The device claim 17, the means for matching comprising means for tuning the tunable capacitor to one of a plurality of discrete capacitance values by at least one of coupling one or more capacitors of a bank of capacitors to a ground voltage and decoupling the one or more capacitors of the bank of capacitors from the ground voltage to match an impedance between the first circuit and the second circuit.

19. The device of claim 17, the means for matching comprising means for setting the tunable capacitor to one of a plurality of discrete capacitance values by controlling a plurality of switchable elements coupled to a plurality of capacitors of the tunable capacitor.

* * * * *